(12) United States Patent
Kostylev et al.

(10) Patent No.: US 7,755,074 B2
(45) Date of Patent: Jul. 13, 2010

(54) LOW AREA CONTACT PHASE-CHANGE MEMORY

(75) Inventors: Sergey Kostylev, Bloomfield Hills, MI (US); Tyler Lowrey, West Augusta, VA (US)

(73) Assignee: Ovonyx, Inc., Rochester Hills, MI (US)

( * ) Notice: Subject to any disclaimer, the term of this patent is extended or adjusted under 35 U.S.C. 154(b) by 54 days.

(21) Appl. No.: 11/871,786

(22) Filed: Oct. 12, 2007

(65) Prior Publication Data

US 2009/0095949 A1 Apr. 16, 2009

(51) Int. Cl.
*H01L 29/04* (2006.01)
*H01L 47/00* (2006.01)
(52) U.S. Cl. .................................. 257/3; 257/E45.001
(58) Field of Classification Search ..................... 257/3, 257/E45.001
See application file for complete search history.

(56) References Cited

U.S. PATENT DOCUMENTS

| 2004/0234895 A1* | 11/2004 | Lee et al. ................... 430/311 |
| 2005/0139816 A1* | 6/2005 | Jeong et al. ................ 257/2 |
| 2006/0118913 A1* | 6/2006 | Yi et al. .................... 257/613 |

* cited by examiner

*Primary Examiner*—Zandra Smith
*Assistant Examiner*—Jamie Niesz
(74) *Attorney, Agent, or Firm*—Honigman Miller Schwartz and Cohn LLP

(57) ABSTRACT

A memory device includes a first electrode and a second electrode. A phase-change material is disposed between the first and second electrodes. The phase-change material is in electrical communication with the first and second electrodes at a first contact region and a second contact region respectively. The first and second contact regions are similar in contact area. The device enables scaling of reset current to smaller dimensions without encountering a limitation imposed by an offset current.

22 Claims, 8 Drawing Sheets

LOW AREA CONTACT PHASE-CHANGE MEMORY

TECHNICAL FIELD

The embodiments described herein are generally directed to memory devices including a phase-change material.

BACKGROUND

Non-volatile memory devices are used in certain applications where data must be retained when power is disconnected. Applications include general memory cards, consumer electronics (e.g., digital camera memory), automotive (e.g., electronic odometers), and industrial applications (e.g., electronic valve parameter storage). The non-volatile memories may use phase-change memory materials, i.e., materials that can be switched between a generally amorphous and a generally crystalline state, for electronic memory applications. The memory of such devices typically comprises an array of memory elements, each element defining a discrete memory location and having a volume of phase-change memory material associated with it. The structure of each memory element typically comprises a phase-change material, one or more electrodes, and one or more insulators.

One type of memory element originally developed by Energy Conversion Devices, Inc. utilizes a phase-change material that can be, in one application, switched between a structural state of generally amorphous and generally crystalline local order or between different detectable states of local order across the entire spectrum between completely amorphous and completely crystalline states. These different structured states have different values of resistivity and therefore, each state can be determined by electrical sensing. Typical materials suitable for such applications include those utilizing various chalcogenide materials. Unlike certain known devices, these electrical memory devices typically do not use field-effect transistor devices as the memory storage element. Rather, they comprise in the electrical context, a monolithic body of thin film chalcogenide material. As a result, very little area is required to store a bit of information, thereby providing for inherently high-density memory chips.

The state change materials are also non-volatile in that, when set in either a crystalline, semi-crystalline, amorphous, or semi-amorphous state representing a resistance value, that value is retained until reprogrammed, as that value represents a physical state of the material (e.g., crystalline or amorphous). Further, reprogramming requires energy to be provided and dissipated in the device. Thus, phase-change memory materials represent a significant improvement in non-volatile memory technology.

In an effort to improve scaling of the memory device to improve the density of memory arrays, one technique is to reduce the area of a bottom contact. However, focusing on only the bottom contact area leads to asymmetrical top and bottom contact areas. That is to say, the bottom contact is small and the upper contact is large in comparison with each other. Thus, a "mushroom", which is the volume of phase-change material that changes state when the memory device is programmed, is small near the bottom contact and large near the top contact. A "mushroom" shape is described with respect to FIG. 15 of U.S. Pat. No. 7,005,666 (issued Feb. 28, 2006), the contents of which is incorporated herein by reference in its entirety. Moreover, the efforts in reducing the size of the bottom contact create highly non-symmetrical contact areas. The result is that the programming current and offset current are large due to the volume of phase-change material that must be switched. These memory devices do not reduce the amount of programming current required to operate the memory device because, even with a low area bottom contact, the volume of phase-change memory being switched is large. This leads to an "offset current" where when plotting programming current vs. bottom electrode contact area, a positive offset current is observed when extrapolating to zero area.

Other attempts to reduce the offset current include a ring-type top contact. However, the switched phase-change volume and the offset current are not dramatically reduced. Yet another method includes increasing the resistivity of the bottom contact and modifying the shape of the bottom contact. In some cases, the programming current may be reduced but the offset current is not dramatically reduced. Yet another method uses a resistive layer (e.g., a breakdown layer) between the top and bottom contact that is broken down in a small area in the first switching operation. However, consistency of operation may be difficult to control in mass production.

Therefore, a need has arisen to reduce reset and offset current of a phase-change memory device. Moreover, it is desirable to reduce the manufacturing costs and process difficulties for producing the bottom contact. Additionally, it is desirable to increase the stability and cycle-life of the memory devices through reduced programming currents.

SUMMARY

A memory device includes a first electrode and a second electrode. A phase-change material is disposed between the first and second electrodes. The phase-change material is in electrical communication with the first and second electrodes at a first contact region and a second contact region respectively. The first and second contact regions have substantially the same contact area.

In another example, a memory device includes a first insulator having a first hole therethrough and a first spacer around the inner periphery of the first hole. The first spacer has a first sublithographic hole therethrough. A second insulator has a second hole therethrough and a second spacer around the inner periphery of the second hole. The second spacer has a second sublithographic hole therethrough. A phase-change material is disposed between the first and second insulators. A first electrode is formed through the first sublithographic hole and is in electrical communication with the phase-change material at a first contact region. A second electrode is formed through the second sublithographic hole and is in electrical communication with the phase-change material at a second contact region. The first and second contact regions have substantially the same area.

Also described is a method of making a memory device. The method includes providing a first insulator; configuring a first hole having a lithographic-dimensioned diameter through the first insulator; providing a first conductive layer and filling the first hole to provide a first contact; configuring a portion of the first conductive layer and leaving the first contact; providing a phase-change material over the first insulator and in electrical communication with the first contact; providing a second insulator over the phase-change material; configuring a second hole through the second insulator, the second hole having substantially the same lithographic-dimension as the first hole; and providing a second conductive layer and filling the second hole to provide a second contact in electrical communication with the phase-change material.

Additionally, the method may include providing a first spacer layer of insulative material over the first insulator and in the first hole, before providing the phase-change material; configuring a portion of the first spacer layer to create a first sublithographic hole through the first hole, before providing the phase-change material; providing a second spacer layer of insulative material over the second insulator and in the second hole, before providing the second conductive layer; and configuring a portion of the second spacer layer to create a second sublithographic hole through the second hole, before providing the second conductive layer.

BRIEF DESCRIPTION OF THE DRAWINGS

The features and inventive aspects will become more apparent upon reading the following detailed description, claims, and drawings, of which the following is a brief description:

DETAILED DESCRIPTION

Figure 1:
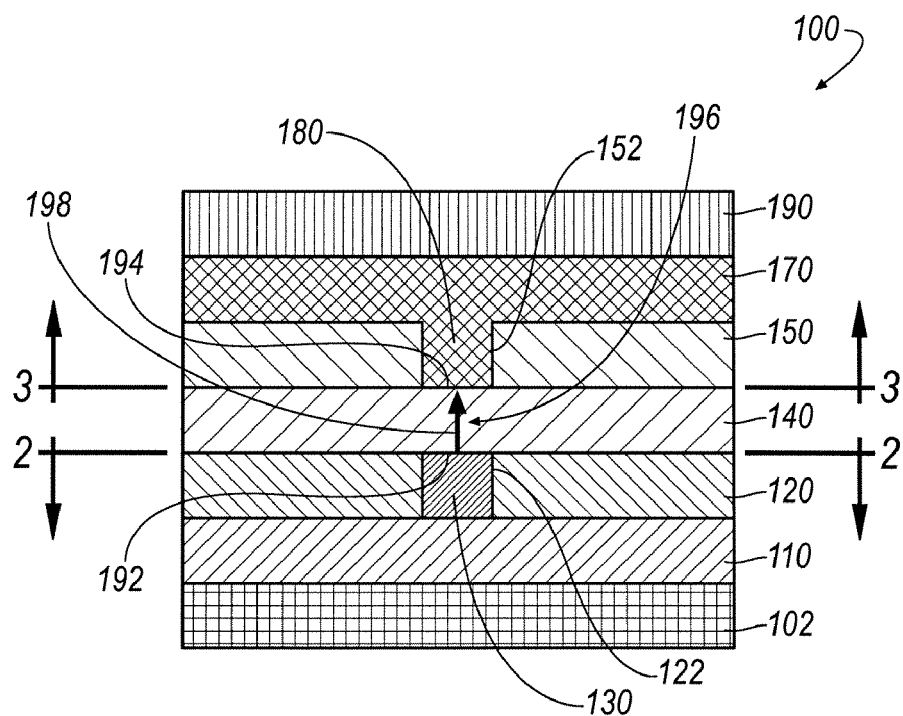
FIG. 1 is a cross-sectional view of a phase-change memory device.

Referring now to the drawings, illustrative embodiments are shown in detail. Although the drawings represent the embodiments, the drawings are not necessarily to scale and certain features may be exaggerated to better illustrate and explain novel aspects of an embodiment. Further, the embodiments described herein are not intended to be exhaustive or otherwise limit or restrict the claims to the precise form and configuration shown in the drawings and disclosed in the following detailed description.

Embodiments of a memory device, including a phase-change memory material, are described in detail herein. A phase-change layer is provided between a first and second electrode that protrude through insulators and electrically communicate with the phase-change layer. The first and second electrodes have substantially the same contact area with the phase-change layer to reduce offset current and programming currents for the memory device. In another embodiment, an anisotropic etching technique is used to provide spacers around the electrodes in order to achieve sublithographic dimensions for the contact areas of the first and second electrodes, further reducing the offset and programming current.

The memory device may be written to and read in a manner described in U.S. Pat. No. 6,687,153, issued Feb. 3, 2004, to Lowrey, for "Programming a Phase-Change Material Memory", which is hereby incorporated by reference in its entirety, as well as other methods known to those skilled in the art. The memory device may also be configured as an array of devices such that a high-density memory array is created.

In yet another aspect, the memory device may be configured to provide multi-level storage. That is to say, the memory device may have a plurality of discrete and identifiable states allowing for multi-bit storage in a single memory element, rather than a common binary storage element. The phase-change memory material may be configured, along with adjacent structures, to facilitate multi-level storage in an improved manner.

FIG. 1 is a cross-sectional view of an embodiment of a phase-change memory device 100. Exemplary memory device 100 includes a lower isolation layer 102, a first interconnect 110, a first insulator 120, a phase-change layer 140, a second insulator 150, a second interconnect 170, and a capping insulator 190. A first electrode 130 is part of the conductive structure of first interconnect 110 and protrudes through first insulator 120 to electrically communicate with phase-change layer 140. Similarly, a second electrode 180 is part of the conductive structure of second interconnect 170 and protrudes through second insulator 150 to electrically communicate with phase-change layer 140. Of note is that a first contact region 192 and a second contact region 194 have substantially the same area, which is explained below in detail with respect to FIGS. 2 and 3.

Lower isolation layer 102 may be made of, for example, $SiO_2$ (silicon dioxide) or other insulators, and is readily deposited by techniques such as chemical vapor deposition (CVD). In general, lower isolation layer 102 is optional but may be provided to electrically and thermally insulate memory device 100, and in particular, first interconnect 110 from other circuitry that may be constructed below memory device 100.

First interconnect 110 and second interconnect 170 are made of a metal, metal alloy, metal-containing compound (e.g. Ti, TiAlN, TiSiN, TiN, MoN) or carbon and may be deposited by sputtering or evaporation) and are used to electrically connect external circuitry (not shown) to memory device 100 for the reading and writing operations of memory device 100. First electrode 130 and the remainder of first interconnect 110 may be comprised of different materials. Likewise, second electrode 180 and the remainder of second interconnect 170 may be comprised of different materials. First insulator 120 and second insulator 150 may be made of $SiO_2$ (silicon dioxide), SiN (silicon nitride), other oxide or nitride, or other insulators, that electrically and thermally insulate phase-change layer 140 from first interconnect 110 and second interconnect 170, respectively.

First insulator 120 includes a first hole 122 that first electrode 130 protrudes through. First electrode 130 provides an electrical connection from first interconnect 110 to phase-change layer 140. Second insulator 150 includes a second hole 152 that second electrode 180 protrudes through. Second electrode 180 provides an electrical connection from phase-change layer 140 to second interconnect 170. An active region 196 of the device includes the phase-change material (of phase-change layer 140) that is between first electrode 130 and second electrode 180.

Phase-change layer 140 is provided as a layer of phase-change memory material, such as chalcogenide, and is in electrical communication with first electrode 130 and second electrode 180. Phase-change layer 140, in one embodiment, is a $Ge_2Sb_2Te_5$ chalcogenide alloy (hereinafter referred to as GST225). As used herein, the term phase-change memory material refers to a material capable of changing between two or more phases that have distinct electrical characteristics. Phase-change layer 140 preferably includes at least one chalcogen element selected from Te, S and Se, and may further include one element selected from the group consisting of Ge, Sb, Bi, Pb, Sn, As, Si, P, O, N, In and mixtures thereof. Suitable phase-change materials include, but are not limited to, GaSb, InSb, InSe, $Sb_2Te_3$, GeTe, $Ge_2Sb_2Te_5$, InSbTe, GaSeTe, $SnSb_2Te_4$, InSbGe, AgInSbTe, (GeSn)SbTe, GeSb (SeTe), and $Te_{81}Ge_{15}Sb_2S_2$. Other examples of suitable phase-change materials are described in U.S. patent application Ser. Nos. 11/200,466 and 11/301,211, the disclosures of which are incorporated in their entirety herein. Phase-change materials in accordance with the instant invention further include pnictide compositions.

The resistivity of chalcogenide phase-change materials generally varies by two or more orders of magnitude when the chalcogenide material changes phase from an amorphous state (more resistive) to a polycrystalline state (less resistive). Interconnects 110, 170 and their respective electrodes 130, 180, deliver an electric current to the phase-change memory material. As the electric current passes from first electrode 130 to second electrode 180 through phase-change layer 140, at least a portion of the electric energy of the electron flow is transferred to the surrounding material as heat. That is, the electrical energy is converted to heat energy via Joule heating. The amount of electrical energy converted to heat energy increases with the resistivity of the electrical contact (and memory material) as well as with the current density (i.e., current divided by area), passing through the electrical contact and the memory material.

In the operation of memory device 100, first electrode 130 and second electrode 180 are connected to support circuitry (not shown) for programming (e.g., writing information) and reading memory device 100. The support circuitry may include the capability to program and read memory device 100 in binary mode, which provides two states, as well as a multi-level mode, which provides a variable number of states.

Figure 1A:
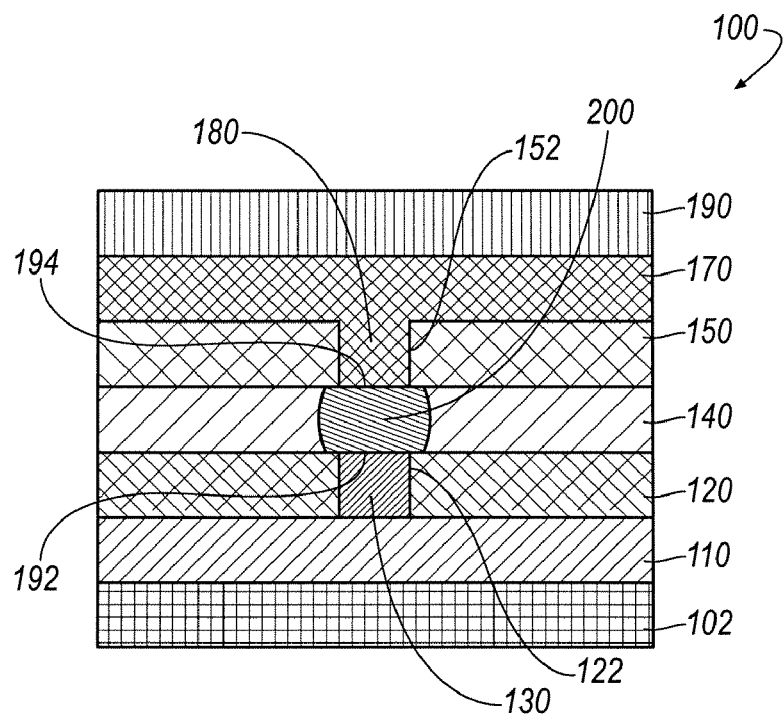
FIG. 1A is a cross-sectional view of the phase-change memory device of FIG. 1 that also shows phase-change function.

When combined with support circuitry, first electrode 130 is provided with a source current 198 (shown by the arrow) that flows through phase-change layer 140 to second electrode 180. As shown in FIG. 1A, when phase-change layer 140 is heated, a programmed volume 200 forms between first and second electrodes 130, 180. Programmed volume 200 serves as the data storage region of the device at active region 196 (see FIG. 1). When active region 196 is heated to a melting point and then cooled slowly, active region 196 cools in a crystalline "set" state, which is a low resistance state. When active region 196 is heated to a melting point and cooled rapidly, active region 196 cools in an amorphous "reset" state, which is a high resistance state. The device resistance is read between electrodes 130, 180 to determine the "set" or "reset" state. In multi-level embodiments, the thermal environment (including temperature and rate of cooling) may be controlled through variations in the amplitude, shape, and duration of the programming pulse to achieve programmed states with a resistance between the resistance of the set state and reset state. The various resistance states reflect varying proportions of two or more different phases of a phase-change material and these proportions may be controlled through the characteristics of the programming pulses.

Lower isolation layer 102 and capping insulator 190 prevent leakage of current from first interconnect 110 and second interconnect 170 to surrounding structures. When electrode source current 198 is provided, an electrical circuit path is formed from first electrode 130 through phase-change layer 140 and to second electrode 180. Because electrodes 130, 180 are opposite each other relative to phase-change layer 140, there is a substantially vertical flow of current. As discussed more fully hereinbelow, it is desirable to insure that the current pathway of source current 198 is substantially vertical from first electrode 130 to second electrode 180 with minimal lateral dispersion through phase-change layer 140. This serves to minimize lateral dispersion of electrical energy or current in the phase-change material thus reducing the lateral extent of programmed volume 200 thus reducing the energy required for programming to provide for more efficient device programming and better scaling of device performance to smaller dimensions. Thus, it is preferable that programmed volume 200 be more nearly cylindrical in shape (as depicted in the embodiment of FIG. 1A) rather than "mushroom" or "plume" shaped.

Figure 2:
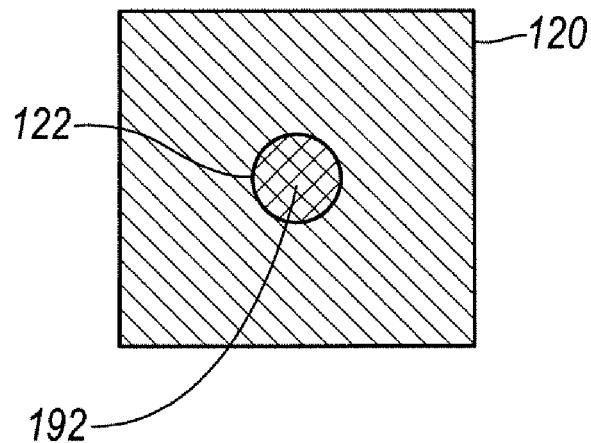
FIG. 2 is a cross-sectional view of a first contact region of the memory device of FIG. 1.

FIG. 2 is a cross-sectional view of first contact region 192 of the memory device of FIG. 1. First electrode 130 protrudes through first hole 122 of first insulator 120. In one example, first contact region 192 directly interfaces phase-change layer 140 to provide the electrical contact. In another example, a carbon layer (not shown) may be provided between first contact region 192 and phase-change layer 140. Here, first contact region 192 electrically communicates with phase-change layer 140 through the carbon layer. The carbon layer may be used as an etch-stop and/or to modify the contact resistance. In general, first contact region 192 may be configured as a circular region, a trench, or other enclosed or open shape.

Figure 3:
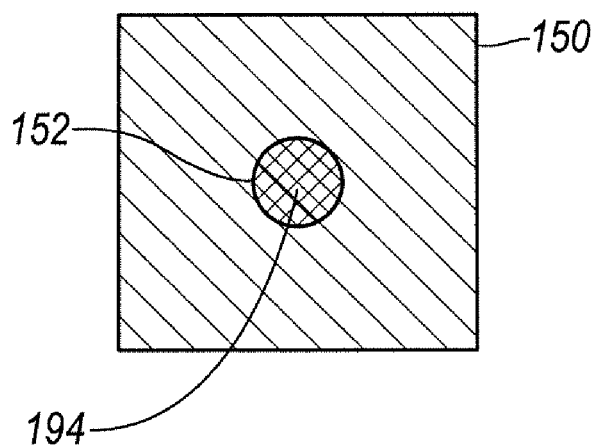
FIG. 3 is a cross-sectional view of a second contact region of the memory device of FIG. 1.

FIG. 3 is a cross-sectional view of second contact region 194 of the memory device of FIG. 1. Second electrode 180 protrudes through second hole 152 of second insulator 150. In one example, second contact region 194 directly interfaces phase-change layer 140 to provide the electrical contact. In another example, a carbon layer (not shown) may be provided between second contact region 194 and phase-change layer 140 as an etch-stop and/or to modify the contact resistance. Here, second contact region 194 electrically communicates with phase-change layer 140 through the carbon layer. In general, second contact region 194 may be configured as a circular region, a trench, or other enclosed or open shape. In one embodiment, to maximize symmetry, first contact region 192 and second contact region 194 are configured to have the same or similar shape and the same or similar area.

When reviewing the embodiment depicted in FIGS. 2 and 3, first contact region 192 and second contact region 194 have substantially the same area and same shape. Thus, electrodes 130, 180 have substantially the same contact area (e.g., electrical communication area) with phase-change layer 140. Such a configuration provides substantially symmetrical contact areas for the opposing electrodes of the device. The similarly sized contact regions 192, 194 inhibit lateral dispersion of electrical energy within active region 196 of the device and promote the formation of a more nearly cylindrical programmed volume 200 between first electrode 130 and second electrode 180. The more nearly cylindrical programmed volume of the instant devices is in contrast to the "mushroom" or "plume" structures of active regions of prior art devices, which include contact regions that differ in contact area. For example, "mushroom"-like active regions are observed in memory devices having a small lower electrode and a large upper electrode.

In an embodiment, the diameters of first contact region 192 and second contact region 194 are in a range of five hundred Angstroms (500 Å) to one thousand five hundred Angstroms (1500 Å). In another embodiment, the diameters of first contact region 192 and second contact region 194 are in a range of five hundred Angstroms (500 Å) to one thousand Angstroms (1000 Å). In yet another embodiment, the diameters of first contact region 192 and second contact region 194 are in a range of four hundred Angstroms (400 Å) to one thousand Angstroms (1000 Å). In still another embodiment, the diameters of first contact region 192 and second contact region 194 are in a range of two hundred Angstroms (200 Å) to eight hundred Angstroms (800 Å). In a further embodiment, the diameters of first contact region 192 and second contact region 194 are in a range of fifty Angstroms (50 Å) to two hundred Angstroms (200 Å). Although these ranges for the diameters of first contact region 192 and second contact region 194 are provided, it is understood that as lithographic processes improve that the diameters will scale to smaller dimensions with the technology.

The effect of adjusting the top contact area (e.g., second contact region 194 of FIGS. 1 and 3) to be symmetrical to the lower contact area (e.g. first contact region 192 is to reduce the offset current as well as reducing programming currents generally. By scaling first contact region 192 and second contact region 194 together with substantially similar areas, active region 196 is reduced in volume as compared to asymmetrical "mushroom" devices having a small lower contact and a large upper contact. Further discussion of the benefits of the instant devices are presented hereinbelow in Example 1 and Example 2.

Figure 4:
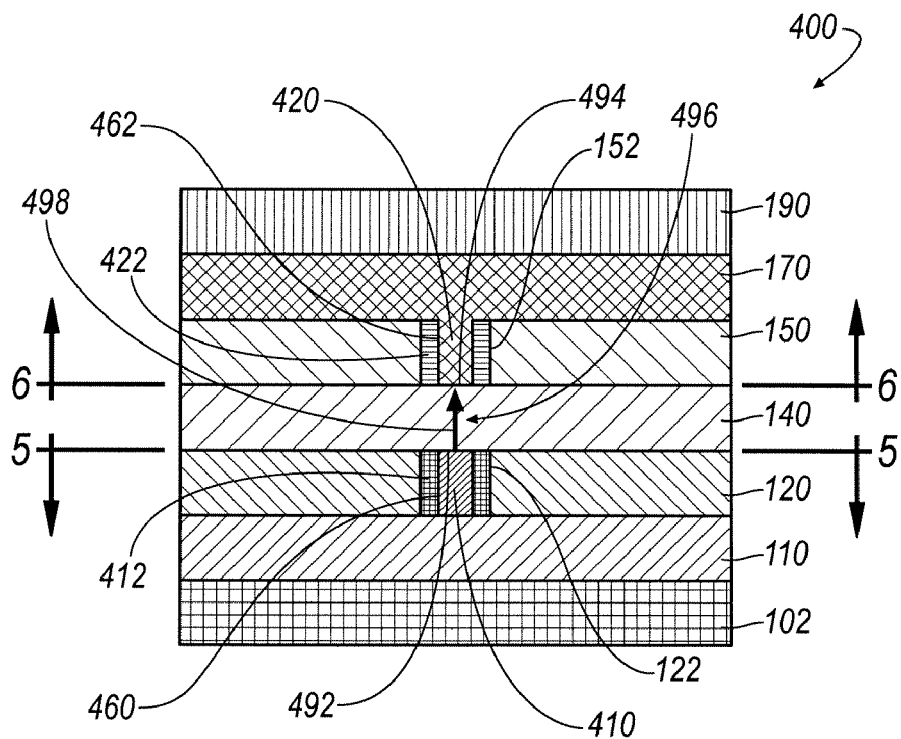
FIG. 4 is a cross-sectional view of an alternative phase-change memory device.

FIG. 4 is a cross-sectional view of an alternative phase-change memory device 400 in accordance with the instant invention. In general, phase-change memory device 400 operates similarly to the phase-change device 100 of FIG. 1. However, alternative phase-change memory device 400 includes a first spacer 412 and a second spacer 422 to achieve sublithographic features for a first contact region 492 and a second contact region 494. Thus, programmed volume 200 may be further reduced through use of spacers formed over lithographic features.

First spacer 412 and second spacer 422 are formed after deposition and patterning of first insulator 120 and second insulator 150, respectively. This is done by conformally depositing an insulating layer over the patterned first insulator 120 and second insulator 150, respectively. Spacers 412, 422 are then respectively formed by anisotropic dry etching the insulating layer, for example, such that only the portions shown in FIG. 4 remain. A first sublithographic hole 460 is formed within first hole 122. Similarly a second sublithographic hole 462 is formed within second hole 152.

When spacers 412, 422 are formed within holes 122, 152, they allow for the construction of sublithographic features for a reduced-size first electrode 410 and a reduced-size second electrode 420. Where holes 122, 152 are formed using the smallest lithographic dimension, the addition of spacers 412, 422 allow for electrodes 410, 420 to be deposited within holes 460 and 462 resulting in a smaller electrode area than the smallest lithographic dimension.

First electrode 410 is part of the conductive structure of first interconnect 110 and protrudes through first insulator 120 and first spacer 412 to electrically communicate with phase-change layer 140. Similarly, second electrode 420 is part of the conductive structure of second interconnect 170 and protrudes through second insulator 150 and second spacer 422 to electrically communicate with phase-change layer 140. Of note is that first contact region 492 and second contact region 494 have substantially the same area, which is explained below in detail with respect to FIGS. 5 and 6.

Figure 4A:
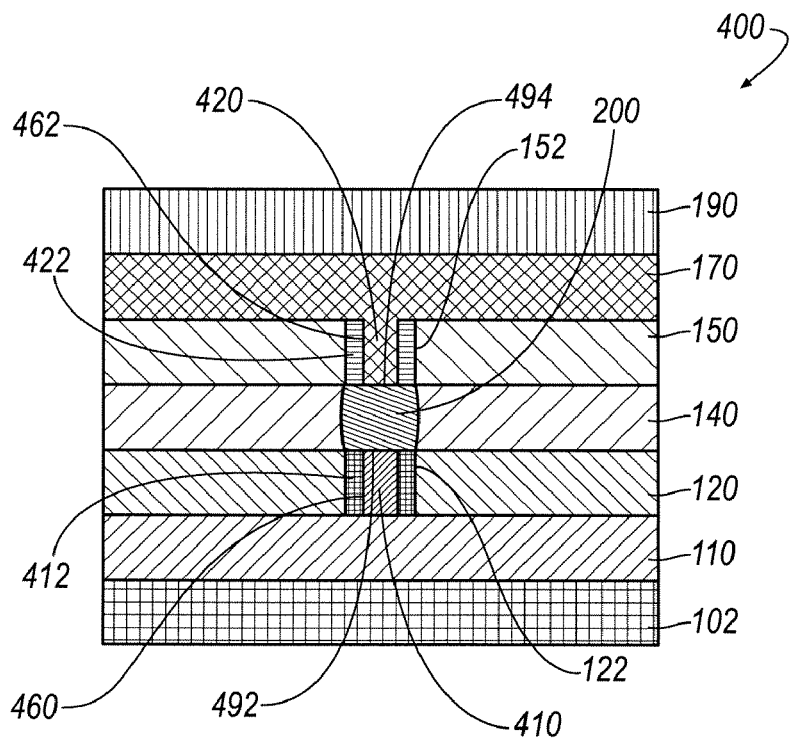
FIG. 4A is a cross-sectional view of the phase-change memory device of FIG. 4 that also shows phase-change function.

An active region 496 of the device includes the phase-change material (of phase-change layer 140) that is directly between first electrode 410 and second electrode 420. In operation, first electrode 410 is provided with a source current 498 (shown by the arrow) that flows through phase-change layer 140 to second electrode 420. As shown in FIG. 4A, when phase-change layer 140 is heated, nearly cylindrical programmed volume 200 forms between first and second electrodes 410, 420. Programmed volume 200 behaves as the data storage region of the device at active region 496. In comparison to programmed volume 200 of FIG. 1A, programmed volume 200 of FIG. 4A is narrower (e.g., has a smaller cross-sectional area) because contact regions 492, 494 are smaller due to inclusion of spacers 412 and 422. Programmed volume 200 of FIG. 4A is more nearly cylindrical in shape than "mushroom" shaped. While not wishing to be bound by theory, the less divergent shape of programmed volume 200 of FIG. 4A can be attributed to the similarity in the areas of contact of first electrode 410 and second electrode 420 with phase-change material 140.

Figure 5:
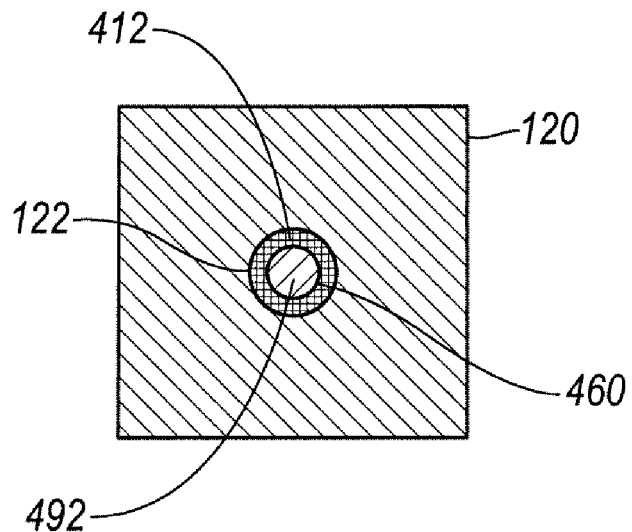
FIG. 5 is a cross-sectional view of an alternative first contact region of the memory device of FIG. 4.

FIG. 5 is a cross-sectional view of first contact region 492 and first sublithographic hole 460 of the memory device of FIG. 4. First electrode 410 protrudes through first hole 122 of first insulator 120 and also first spacer 412 (see FIG. 4). First spacer 412 is formed within first hole 122 using conformal insulator deposition and anisotropic etching and provides a sublithographic feature size for first electrode 410 (e.g., first sublithographic hole 460). In one example, first contact region 492 directly interfaces phase-change layer 140 to provide the electrical communication therebetween. In another example, an etch-stop layer (e.g., a carbon layer) may be provided between first contact region 492 and phase-change layer 140. In this case, first contact region 492 electrically communicates with phase-change layer 140 through the etch-stop layer. A carbon layer may be used as an etch-stop and/or to modify the contact resistance. In general, first contact region 492 may be configured as a circular region, trench, or other enclosed or open shape.

Figure 6:
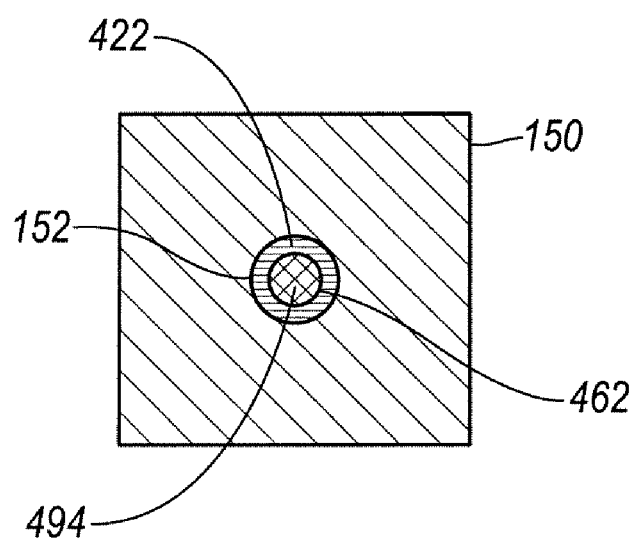
FIG. 6 is a cross-sectional view of an alternative second contact region of the memory device of FIG. 4.

FIG. 6 is a cross-sectional view of second contact region 494 of the memory device of FIG. 4. Second electrode 420 protrudes through second hole 152 of second insulator 150 and also second spacer 422 (see FIG. 4). In one example, second contact region 494 directly interfaces phase-change layer 140 to provide the electrical communication therebetween. In another example, a carbon layer may be provided between second contact region 494 and phase-change layer 140. In this case, second contact region 494 electrically communicates with phase-change layer 140 through the etch-stop layer. A carbon layer may be used as an etch-stop and/or to modify the contact resistance. In general, second contact region 494 may be configured as a circular region, a trench, or other enclosed or open shape. In one embodiment, to maximize symmetry between first contact region 492 and second contact region 494, both contact regions are configured similarly in size and shape.

When reviewing the embodiments of FIGS. 5 and 6 together, first contact region 492 and second contact region 494 have substantially the same area (i.e., the contacting surfaces are substantially the same size). Thus, electrodes 410, 420 have substantially the same contact area with phase-change layer 140. Such a configuration provides substantially symmetrical contact areas for the opposing electrodes of the device. The similarly sized contact regions 492, 494 inhibit lateral dispersion of electrical energy within active region 496 of the device and promote the formation of a more nearly cylindrical programmed volume 200 between first electrode 410 and second electrode 420. The more nearly cylindrical programmed volume of the instant devices is in contrast to the "mushroom" or "plume" structures of active regions of prior art devices, which include contact regions that differ in contact area. For example, "mushroom"-like active regions are seen with memory devices having a small lower electrode and a large upper electrode. Moreover, programmed volume 200 of FIG. 4A is smaller in cross-sectional area than programmed volume 200 of FIG. 1A because the areas of contact regions 492, 494 are smaller than the areas of contact regions 192, 194 (shown in FIGS. 2-3). Indeed, the area of contact regions 492, 494 are provided as sublithographic features by spacers 412, 422.

In an embodiment, the diameters of first hole 122 and second hole 152 are in a range of five hundred Angstroms (500 Å) to one thousand five hundred Angstroms (1500 Å). In a more preferred embodiment, the diameters of first hole 122 and second hole 152 are in a range of five hundred Angstroms (500 Å) to one thousand Angstroms (1000 Å). In another preferred embodiment, the diameters of first hole 122 and second hole 152 are in the range of five hundred Angstroms (500 Å) to seven hundred Angstroms (700 Å). Although these ranges for the diameters of first hole 122 and second hole 152 are provided, it is understood that as lithographic processes improve that the diameters will scale to smaller dimensions with the technology. Because spacers 412, 422 are provided on the inner periphery of first hole 122 and second hole 152 (which have standard lithographic features sizes), the area of first contact region 492 and second contact region 494 are necessarily smaller. This is because first sublithographic hole 460 and second sublithographic hole 462 have sublithographic feature sizes due to the configuration process (e.g., anisotropic etching). Thus, the diameters for first contact region 492 and second contact region 494 (as defined by first sublithographic hole 460 and second sublithographic hole 462), in an embodiment, are in a range of one hundred and fifty Angstroms (150 Å) to five hundred Angstroms (500 Å). In a more preferred embodiment, the diameters of first hole 122 and second hole 152 are in a range of one hundred and fifty Angstroms (150 Å) to three hundred and fifty Angstroms (350 Å). The feature sizes of first sublithographic hole 460 and second sublithographic hole 462 are also reduced according to the sublithographic process and process parameters employed.

The device structure described in connection with FIG. 1 and FIG. 4 represent embodiments in which the second (e.g. top) contact area is controlled or varied relative to the first (e.g. bottom) contact area through processing steps during device fabrication, where processing may be used to define areas or dimensions at, above or below the lithographic feature size. In alternative embodiments, the area of one contact relative to the other contact may be controlled through a breakdown process. In a breakdown process, the physical sizes of the two device electrodes may be different, but the effective size of the either or both electrodes may be reduced by providing a thin (e.g. 20-40 angstroms thick) resistive or insulating layer between the phase-change material and the either or both electrodes. In the breakdown process, current passed between the two electrodes causes the breakdown layer to puncture in a limited area region. The remainder of the breakdown layer remains intact and electrically insulates the larger electrode(s). During device operation subsequent to breakdown, the area of the punctured region defines the effective area of the larger contact. By controlling the conditions of the breakdown process, punctured areas over a range of sizes can be established. The breakdown process provides a convenient way to examine the influence of contact area on scaling and other performance characteristics of the devices.

Figure 7:
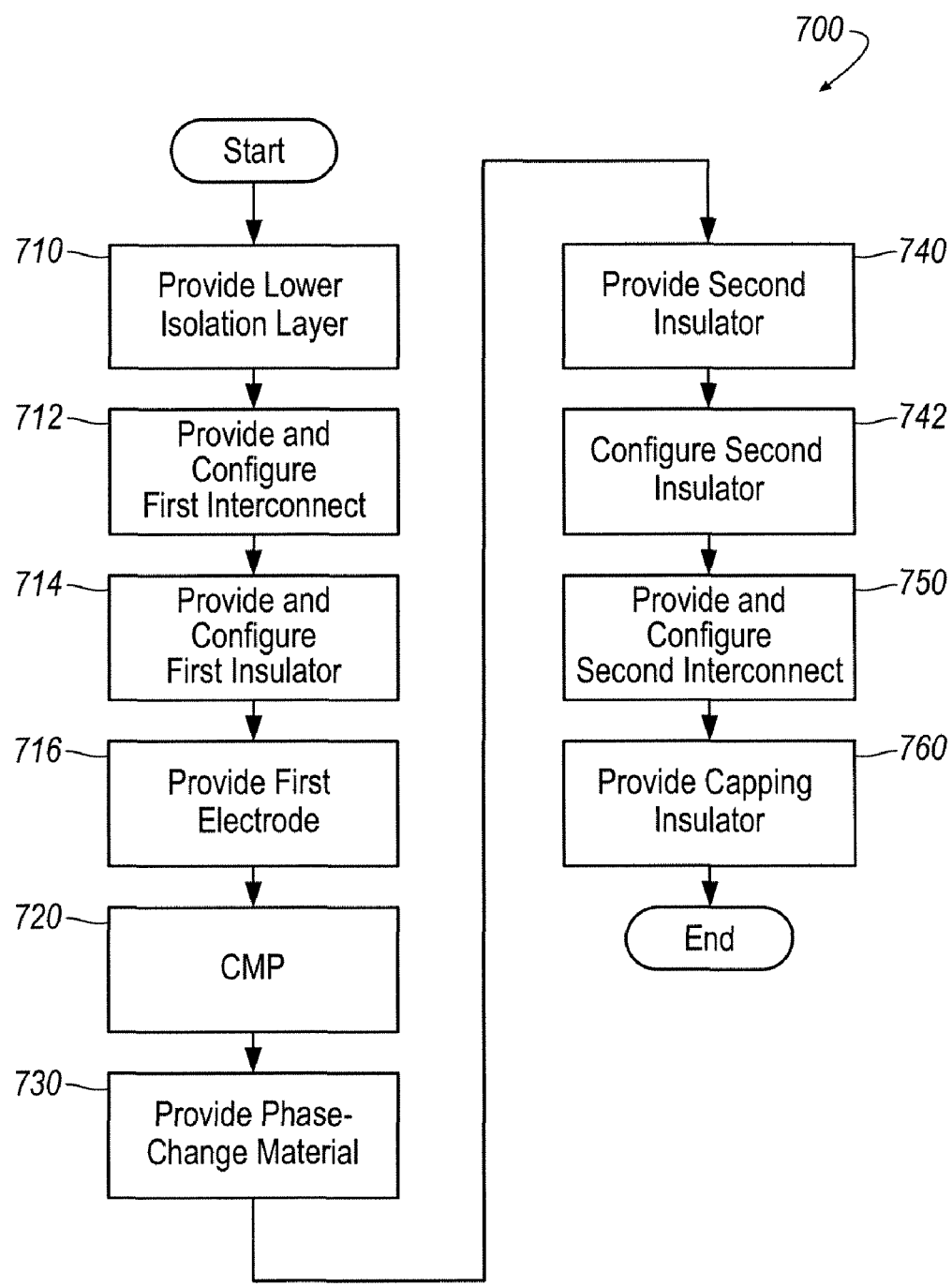
FIG. 7 is a flow diagram of the construction of the improved phase-memory change memory device of FIGS. 1-3.

FIG. 7 is a flow diagram 700 of the construction of the improved phase-change memory device of FIGS. 1-3. In step 710, lower isolation layer 102 is provided. Lower isolation layer 102 may be made of $SiO_2$ (silicon dioxide), or other insulators, and may be deposited by techniques such as chemical vapor deposition (CVD). As is known in the art, $SiO_2$ (silicon dioxide) is a common insulator in semiconductor device technology. Lower isolation layer 102 generally provides electrical and thermal isolation from any structures that memory device 100 may be constructed on top of. Further, lower isolation layer 102 may be provided on top of a wafer that includes semiconductor elements where memory device 100 is to be constructed above or within typical interconnect strata. That is to say, lower isolation layer 102 may be provided on top of a substrate that contains no circuits, partial, or complete circuits and systems that are to be used in conjunction with memory device 100. Alternatively, lower isolation layer 102 may itself be a glass or silicon wafer of suitable properties for constructing memory device 100.

Next, in step 712, first interconnect 110 is provided and configured (i.e. patterned). First interconnect 110 is typically a metal, metal alloy, metal nitride (e.g. Ti, TiAlN, TiSiN, TiN, Mo, MoN, W, TiW etc.) or carbon deposited by, for example, PVD sputtering, evaporation, CVD or electroplating. First interconnect 110 is then patterned using standard photolithography and dry etch techniques. As memory device 100 may be constructed between steps in a semiconductor process, first interconnect 110 may be deposited and patterned along with other interconnect lines for other circuitry constructed on the substrate.

Next, in step 714, first insulator 120 is provided and configured (patterned). First insulator 120 may also be a $SiO_2$ (silicon dioxide) material and may be deposited by CVD. For improved performance, first insulator 120 may be selected for reduced thermal conductivity. Preferably, the thermal conductivity is less than that of $SiO_2$ (silicon dioxide) to provide increased retention of heat in phase-change layer 140 during a programming operations. The alternative materials for first insulator 120 may include, but are not limited to, carbide materials, aerogel, xerogel and their derivatives. Typically, second insulator 150 may comprise a material such as silicon dioxide ($SiO_2$) or silicon nitride ($Si_3N_4$). In a preferred embodiment, silicon dioxide is used. In a more preferred embodiment, silicon nitride is used. First insulator 120 is patterned using standard photolithography and dry etch techniques creating holes, trenches, or other possible shapes through insulator layer 120.

Next, in step 716, first electrode material 130 is provided. First electrode material 130 is typically a metal, metal alloy, metal nitride (e.g. Ti, TiAlN, TiSiN, TiN, Mo, MoN, W, TiW etc.) or carbon deposited by, for example, CVD or electroplating. First electrode material 130 is deposited globally over the top surface of first insulator 120 and into the patterned features of first insulator 120. substantially filling the features. First electrode 130 may be the same or a different material that first interconnect 110. The material used for form first electrode 130 may, for example, have a higher resistivity than the material used to form the first interconnect 110.

Next, in step 720, excess material from the deposition of first electrode material 130 is removed. The excess that is above first insulator 120 is to be removed so that first electrode material 130 only remains in the patterned features (holes, trenches, or other) of first insulator 120 forming plugs. The excess first electrode material is removed using a chemical mechanical polishing (CMP) process. Generally, the horizontal surface of first insulator 120 is cleaned by removing the excess first electrode material to provide a planar surface. When complete, first contact 130 remains as a plug in first hole 122 (shown in FIGS. 1, 1A and 2), leaving first contact region 192 exposed.

Next, in step 730, phase-change layer 140 is provided. Typically, GST225 is deposited in a layer. Other phase-change materials may also be used as discussed above with respect to FIG. 1, including chalcogenide or pnictide alloys. Because any excess material that was above first insulator 120 was removed in step 720, the surface of first insulator 120 is flat. Thus, phase-change layer 140 is provided as a substantially flat layer over the CMP polished surface. Moreover, because first contact region 192 is exposed at the surface of first insulator 120 there is an electrical communication between phase-change layer 140 and first contact region 192 when phase-change layer 140 is deposited. Optionally, after phase-change layer 140 is provided, an etch-stop may be deposited over phase-change layer 140 to protect the phase-change material (which may subject to damage) from other etching processes later employed.

In an alternative embodiment, an additional insulator layer may be deposited over first insulator 120 and first electrode 130. A hole or opening may be formed in the additional insulator to expose first electrode 130 and the phase-change material may be formed within the hole or opening. Optionally, a sidewall layer may be formed within the hole prior to deposition of the phase-change material. Excess phase change material may be removed by CMP.

Next, in step 740, second insulator 150 is provided. Second insulator 150 may comprise a material such as silicon dioxide ($SiO_2$) or silicon nitride ($Si_3N_4$). In a preferred embodiment, silicon dioxide is used. In a more preferred embodiment, silicon nitride is used.

Next, in step 742, second insulator 150 is configured to provide second hole 152. In this step, second hole 152 is etched through second insulator 150 to expose phase-change layer 140 using, in an example, reactive ion etching (RIE). Because second insulator 150 was provided as a layer in step 740, it is necessary to remove material such that second hole 152 is provided through second insulator 150. As noted above in detail with respect to FIGS. 2-3, electrodes 130, 180 are substantially the same size. In particular, first contact region 192 and second contact region 194 have the same surface area when contacting phase-change layer 140. This is accomplished by substantially matching the dimensions of first electrode 130 and second hole 152. The optional etch-stop layer discussed in step 730 may be used to protect phase-change layer 140 from the RIE process or other etching process used to create second hole 152.

Next, in step 750, second interconnect 170 is provided and configured. Typically, second interconnect 170 is a metal, metal alloy, metal nitride (e.g. Ti, TiAlN, TiSiN, TiN, Mo, MoN, W, TiW etc.), carbon or other material as described hereinabove and is deposited by CVD, sputtering, electroplating or evaporation. When deposited, second interconnect 170 fills second hole 152 (through second insulator 150) such that second electrode 180 is formed as a protrusion through second insulator 150. Moreover, second electrode 180 electrically communicates with phase-change layer 140. Second interconnect is configured using standard photolithography and dry etch techniques.

Next, in step 760, capping insulator 190 is provided to isolate memory device 100 electrically and thermally from other circuits or structures that may be constructed over memory device 100. Capping insulator 190 may be made of $SiO_2$ (silicon dioxide), or other insulators, and may be deposited by techniques such as chemical vapor deposition (CVD). As is known in the art, $SiO_2$ (silicon dioxide) is a common insulator in semiconductor device technology.

Figure 8:
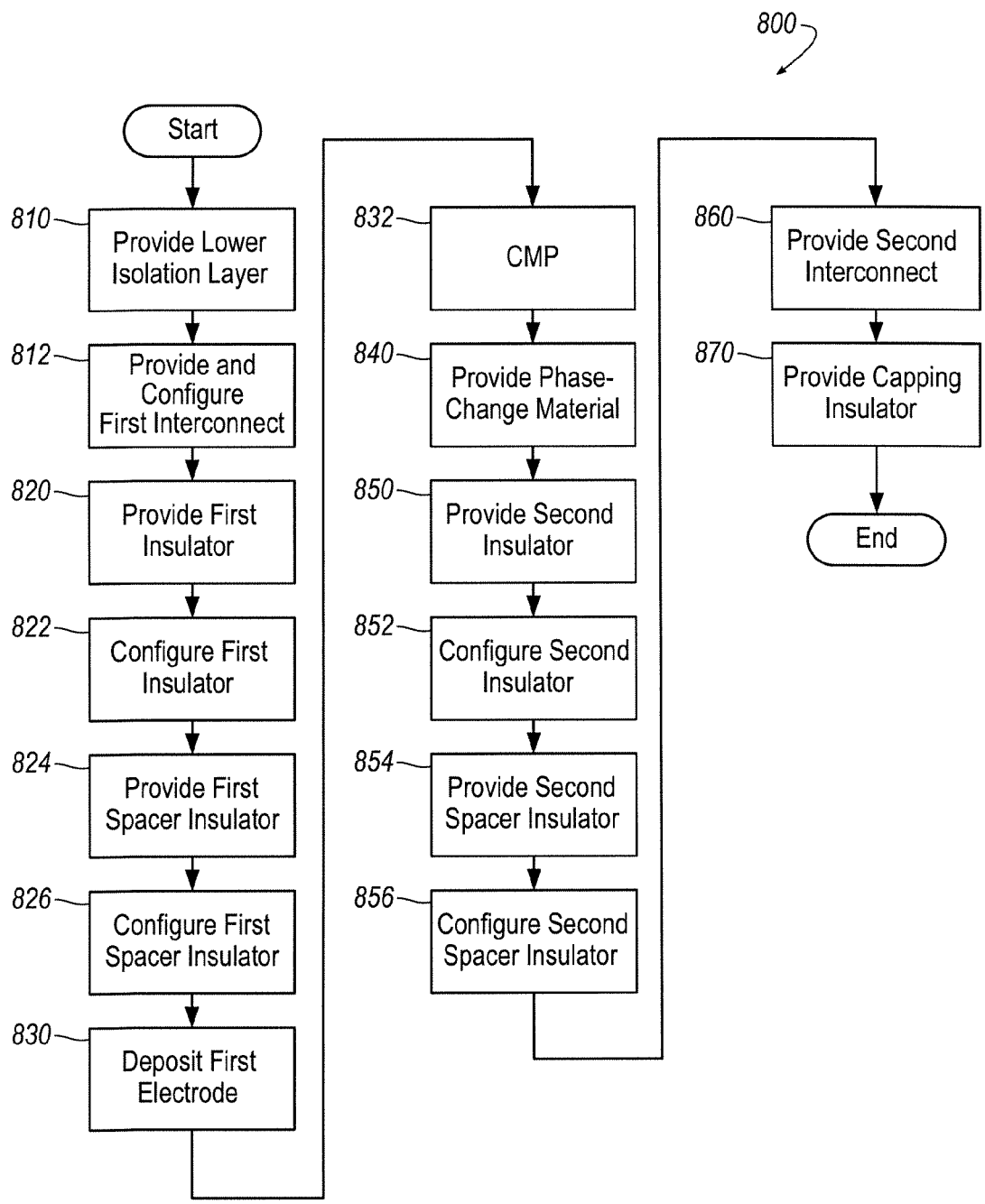
FIG. 8 is a flow diagram of the construction of the improved phase-memory change memory device of FIGS. 4-6.

FIG. 8 is a flow diagram 800 of the construction of phase-change memory device 400 of FIGS. 4-6. In step 810, lower isolation layer 102 is provided. Lower isolation layer 102 may be made of $SiO_2$ (silicon dioxide), or other insulators, and may be deposited by techniques such as chemical vapor deposition (CVD). As is known in the art, $SiO_2$ (silicon dioxide) is a common insulator in semiconductor device technology. Lower isolation layer 102 generally provides electrical and thermal isolation from any structures that memory device 400 is constructed on top of. Further, lower isolation layer 102 may be provided on top of a wafer that includes semiconductor elements where memory device 400 is to be constructed above or within typical interconnect strata. That is to say, lower isolation layer 102 may be provided on top of a substrate that contains no circuits, partial, or complete circuits and systems that are to be used in conjunction with memory device 400. Alternatively, lower isolation layer 102 may itself be a glass or silicon wafer of suitable properties for constructing memory device 400.

Next, in step 812, first interconnect 110 is provided and configured. First interconnect 110 is typically a metal, metal alloy, metal nitride (e.g. Ti, TiAlN, TiSiN, TiN, Mo, MoN, W, TiW etc.) or carbon deposited by, for example, sputtering, CVD or evaporation. As memory device 400 may be constructed between steps in a semiconductor process, first interconnect 110 may be deposited along with other interconnect lines for other circuitry constructed on the substrate. First interconnect 110 is patterned using standard photolithography and dry etch techniques.

Next, in step 820, first insulator 120 is provided. First insulator 120 may also be a $SiO_2$ (silicon dioxide) material and may be deposited by CVD. For improved performance, first insulator 120 may be selected for reduced thermal conductivity. Preferably, the thermal conductivity is less than that of $SiO_2$ (silicon dioxide) to provide increased retention of heat in phase-change layer 140 during a programming operations. The alternative materials for first insulator 120 may include, but are not limited to, carbide materials, aerogel, xerogel and their derivatives.

Next, in step 822, first insulator 120 is configured to provide first hole 122. In this step, first hole 122 is etched through first insulator 120 to expose first interconnect 110 using, in an example, reactive ion etching (RIE). Because first insulator 120 was provided as a layer in step 820, it is necessary to remove some of the insulating material such that first hole 122 is provided through first insulator 120. As noted above in detail with respect to FIGS. 5-6, holes 122, 152 are substantially the same size.

Next, in step 824, an insulation layer is provided (including first spacer 412) above first insulator 120 and into the holes patterned in step 822. Typically, first spacer 412 may comprise a material such as silicon dioxide ($SiO_2$) or silicon nitride ($Si_3N_4$). In a preferred embodiment, silicon dioxide is used. In a more preferred embodiment, silicon nitride is used. The insulating material is deposited conformally in a sheet covering the surface of first interconnect 110 and the sidewalls and bottom of hole 122, providing the base material for first spacer 412.

Next, in step 826, first spacer 412 is configured. Using an anisotropic etching process (e.g., anisotropic dry etching) first spacer 412 is formed leaving first sublithographic hole 460. Because the insulation layer is conformally deposited above first insulator 120, the insulator material also forms within and coats the sidewalls and bottom of first hole 122. Using anisotropic etching, first spacer 412 remains after the etching has removed all conformally deposited insulating material from all horizontal surfaces but leaving the insulator material along the inner sidewall of first hole 122, resulting in first sublithographic hole 460 to first interconnect 110. The etching process is timed such that the insulator deposited on the sidewalls of first hole 122 remains as shown as first spacer 412 (see FIGS. 4 and 5).

In production, parameters such as etching time, angle, etc., may be adjusted such that the sidewalls forming first spacer 412 are left when a path has been etched through to first interconnect 110. After etching, first spacer 412 surrounds the inner side-wall of first hole 122 allowing for the construction of a sublithographic feature (e.g., first sublithographic hole 460) for a reduced-size first electrode 410. Where hole 122 was formed using the smallest lithographic dimension, the addition of first spacer 412 allows for electrode 410 to be deposited within first spacer 412. The sublithographic featuring allows for first contact region 492 (see FIGS. 4 and 5) to have less area than first contact region 192 (see FIGS. 1 and 2) because the cross-sectional diameter of the hole is reduced by first spacer 412.

Next, in step 830, first electrode 410 is deposited. First electrode 410 is typically a metal, metal alloy, metal nitride (e.g. Ti, TiAlN, TiSiN, TiN, Mo, MoN, W, TiW etc.) or carbon deposited by sputtering, evaporation, CVD or electroplating. First electrode 410 is also formed within first spacer 412 and electrically contacts first interconnect 110. Because first spacer 412 was formed using anisotropic etching, first electrode 410 has a sublithographic size when deposited. First electrode 410 may be the same or a different material that first interconnect 110. The material used for form first electrode 410 may, for example, have a higher resistivity than the material used to form the first interconnect 110.

Next, in step 832, excess material from the deposition of first electrode 410 is removed. Because first electrode 410 was formed using conformal deposition across the entirety of the surface of first insulator 120, the excess that is above first insulator 120 is to be removed. Excess material is removed using a chemical mechanical polishing (CMP) process. When complete, first electrode 410 remains as a plug within first spacer 412 which in turn is within first hole 122 (shown in FIGS. 4, 4A, 5 and 6). First contact region 492 remains exposed after the CMP process and possesses a sublithographic dimension because of the formation of first spacer 412.

Next, in step 840, phase-change layer 140 is provided. Typically, GST225 is deposited in a layer. Other phase-change materials may also be used as discussed above, including chalcogenide or pnictide alloys. Because any excess material that was above first insulator 120 was removed in step 832, the surface of first insulator 120 is flat (e.g., planar). Thus, phase-change layer 140 is provided as a substantially flat layer over the CMP polished surface. Because first contact region 492 is exposed at the top surface of first insulator 120, phase-change layer 140 is deposited over both. At first contact region 492 there is an electrical communication with phase-change layer 140. Optionally, after phase-change layer 140 is provided, an etch-stop may be deposited over phase-change layer 140 to protect the phase-change material (which may susceptible to etchants) from other etching processes later employed. Where an etch-stop layer is used, first contact region 494 electrically communicates with phase-change layer 140 through the etch-stop, which may be a carbon-based material.

Next, in step 850, second insulator 150 is provided. Second insulator 150 may comprise a material such as silicon dioxide ($SiO_2$) or silicon nitride ($Si_3N_4$). In a preferred embodiment, silicon dioxide is used. In a more preferred embodiment, silicon nitride is used.

Next, in step 852, second insulator 150 is configured to provide second hole 152. In this step, second hole 152 is etched through second insulator 150 to expose phase-change layer 140 using, in an example, reactive ion etching (RIE). Because second insulator 150 was provided as a layer in step 850, it is necessary to remove some of the insulating material such that second hole 152 is provided through second insulator 150. As noted above in detail with respect to FIGS. 5-6, holes 122, 152 are substantially the same size. Thus, the same or similar lithographic procedures may be used to provide holes 122, 152 having substantially similar cross-sectional areas and diameters.

Next, in step 854, an insulation layer is provided (including second spacer 422) above second insulator 150 and into the holes patterned in step 852. Typically, this insulating layer may comprise a material such as silicon dioxide ($SiO_2$) or silicon nitride ($Si_3N_4$). In a preferred embodiment, a conformally deposited silicon dioxide is used. In a more preferred embodiment, a conformally deposited silicon nitride is used. The insulating layer is deposited as a sheet covering the surface of second insulator 150 and the sidewalls and bottom of second hole 152.

Next, in step 856, second spacer 422 is configured. Using an anisotropic etching process (e.g., anisotropic dry etching) second spacer 422 is formed. Because the insulation layer is conformally deposited above second insulator 150, the insulator material has also formed within second hole 152. Using anisotropic etching, second spacer 422 is formed on the inner periphery of second hole 152 after the etching has fully removed the insulator material from horizontal surfaces both in the central portion of second hole 152 above the phase-change layer 140 and on horizontal surfaces of second insulator 150. The etching is timed such that the insulator deposited on the sidewalls of second hole 152 remains (as shown in FIG. 4) to provide a second sublithographic hole 462. Because phase-change layer 140 may be susceptible to the particular etchants chosen for the anisotropic process (and the process used to form second hole 152), an etch-stop layer may be deposited between phase-change layer 140 and second insulator 150 to prevent damage. The etch-stop layer may be, for example, a thin layer of carbon.

In production, parameters such as etching time, angle, etc., may be adjusted such that the sidewalls forming second spacer 422 are left when a path has been etched through to phase-change layer 140. After etching, second spacer 422 surrounds the inner side-wall of second hole 152 allowing for the construction of a sublithographic feature (e.g., second sublithographic hole 462) for a reduced-size second electrode 420. Where second hole 152 was formed using the smallest lithographic dimension, the addition of second spacer 422 allows for second electrode 420 to be deposited within second spacer 422. The sublithographic featuring allows for second contact region 494 to have less area than second contact region 194 (see FIGS. 1 and 2). This occurs because the size of the hole through second insulator 150 is further is reduced by second spacer 422.

Next, in step 860, second electrode 420 and second interconnect 170 are deposited. Second electrode 420 and second interconnect 170 are typically a metal, metal alloy, metal nitride, carbon or other material as described hereinabove that can be deposited using sputtering, evaporation, CVD or electroplating. Second electrode 420 is also formed within second spacer 422 and electrically contacts phase-change layer 140. Because second spacer 422 was formed using anisotropic etching, second electrode 420 is now a sublithographic size when deposited. Second interconnect 170 may now be connected to external read/write circuitry (not shown). Where an etch-stop is used (as described in step 856) second electrode 420 electrically connects with phase-change layer 140 through the etch stop, an example of which is a carbon-based material.

Next, in step 870, capping insulator 190 is provided to isolate memory device 400 electrically and thermally from other circuits or structures that may be constructed over memory device 400. Capping insulator 190 may be made of $SiO_2$ (silicon dioxide), or other insulators, and may be deposited by techniques such as chemical vapor deposition (CVD). As is known in the art, $SiO_2$ (silicon dioxide) is a common insulator in semiconductor device technology.

EXAMPLE 1

In this example, the difficulties in reducing programming current by reducing the area of contact of one electrode relative to the other electrode are described. The devices used in this example have the general structure depicted in FIG. 1, with the exception that upper contact area 194 is larger than lower contact area 192. A series of devices of this type were considered for this example. The devices differed in the area of the bottom contact, but otherwise included the same structure. In particular, the top contact area remained constant and relatively large in upper contact area for the different devices considered in this example.

Figure 9:
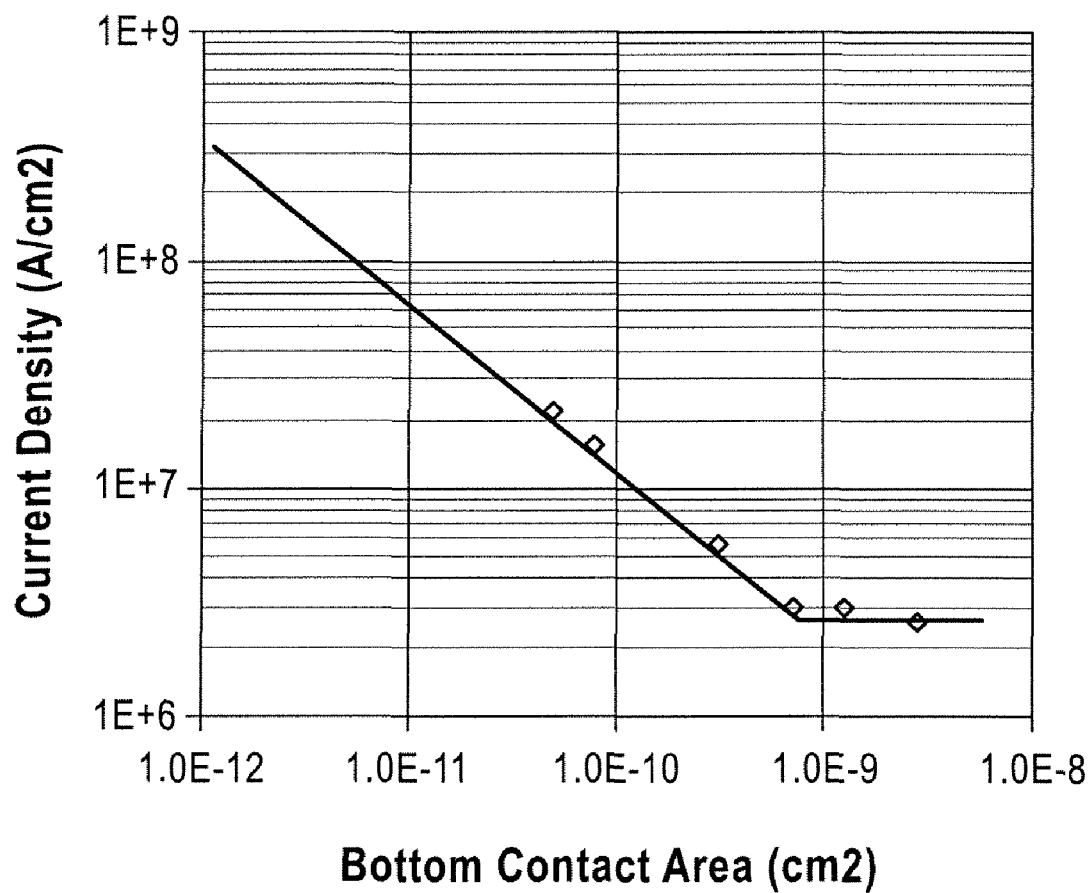
FIG. 9 is a plot of reset current density as a function of bottom contact area for devices exhibiting a disparity in the areas of a first contact region and a second contact region.

The reset current was measured for each of the different devices and the reset current density as a function of bottom contact area was determined. The results are summarized in FIG. 9. The reset current density is the ratio of the measured reset current to the bottom contact area. Data for the different devices are depicted with open diamond symbols and the trend represented by the data is shown as a solid line. The results indicate that the reset current density remains nearly constant when the bottom contact area is near $1.0 \times 10^{-9}$ cm$^2$ or higher (the regime of FIG. 9 represented by the horizontal line). The nearly constant reset current density in this regime indicates that the reset current scales with bottom contact area. The reset current decreases in proportion to the decrease in bottom contact area in this regime.

As the bottom contact area is decreased below the regime of FIG. 9 depicted with the horizontal line, the reset current density increases as the bottom contact area is reduced. This regime is represented by the sloped line shown in FIG. 9. The increase in reset current density indicates that the reset current of the device no longer scales in proportion to the bottom contact area. Instead, the reset current may either decrease less gradually than in direct proportion to the reduction in bottom contact area or level off as the bottom contact area is decreased below a critical size (which, in the embodiment of FIG. 9, corresponds to the bottom contact area at which the line representing the data changes from horizontal to sloped).

While not wishing to be bound by theory, the instant inventors believe that the reset current scales with the volume of phase-change material programmed and that the results of FIG. 9 indicate that when the top contact area is fixed and the bottom contact area is decreased below a critical size, the programmed volume no longer decreases in direct proportion to the bottom contact area. Instead, it is proposed that the asymmetry in the size of the top and bottom contact areas leads to a situation where the larger top contact area plays a role in determining the size of the programmed volume. In effect, as the bottom contact area is reduced relative to a fixed larger top contact area, the programmed volume initially decreases. As the asymmetry (disparity in size) between the top and bottom contact areas becomes more pronounced, however, the top contact becomes more controlling and operates to limit further decrease in programmed volume. The programmed volume reaches a minimum defined by the top contact area and this minimum establishes a minimum reset current for the device irrespective of any further reduction in bottom contact area. This minimum reset current may be referred to herein as an "offset current" and represents a limit on device operation. When the reset current saturates at the offset current value, further reductions in bottom contact area no longer influence the reset current. As a result, as shown in FIG. 9, the reset current density increases with decreasing bottom contact area.

In addition to the volume of programmed phase-change material, the instant inventors further believe that electrical energy losses may become more severe as the asymmetry between the top and bottom contact areas becomes more pronounced. As the programmed volume becomes less cylindrical and more plume-like or mushroom-like in shape, the opportunity for lateral dissipation of energy within the phase-change material increases and more energy is lost. These energy losses may contribute to the offset current.

EXAMPLE 2

In this example, the beneficial scaling effect of the instant, symmetrical contact devices is illustrated. The devices used in this example have the general structure depicted in FIG. 1 and included $Ge_2Sb_2Te_5$ as phase-change material 140. A series of devices were considered for this example. In each device, the top contact area and the bottom contact area were made substantially equal. The contact area was varied for the different devices in the series. The bottom contact area was varied through processing during fabrication and the top contact area was varied according to the breakdown process described hereinabove. Aside from contact area, the different devices otherwise included the same structure. In contrast to the devices of Example 1, in the devices of this example, the top contact area was reduced in unison with the reduction in bottom contact area of the device.

The reset current was measured for each of the different devices and the reset current as a function of bottom contact area was determined. The results are summarized in FIG. 10. Data for the different devices are depicted with filled diamond and square symbols and the trend represented by the data is shown as a solid line. Each set of symbols corresponds to a different set of devices and is represented by a different line. The trend observed for each set of devices, however, was similar.

Figure 10:
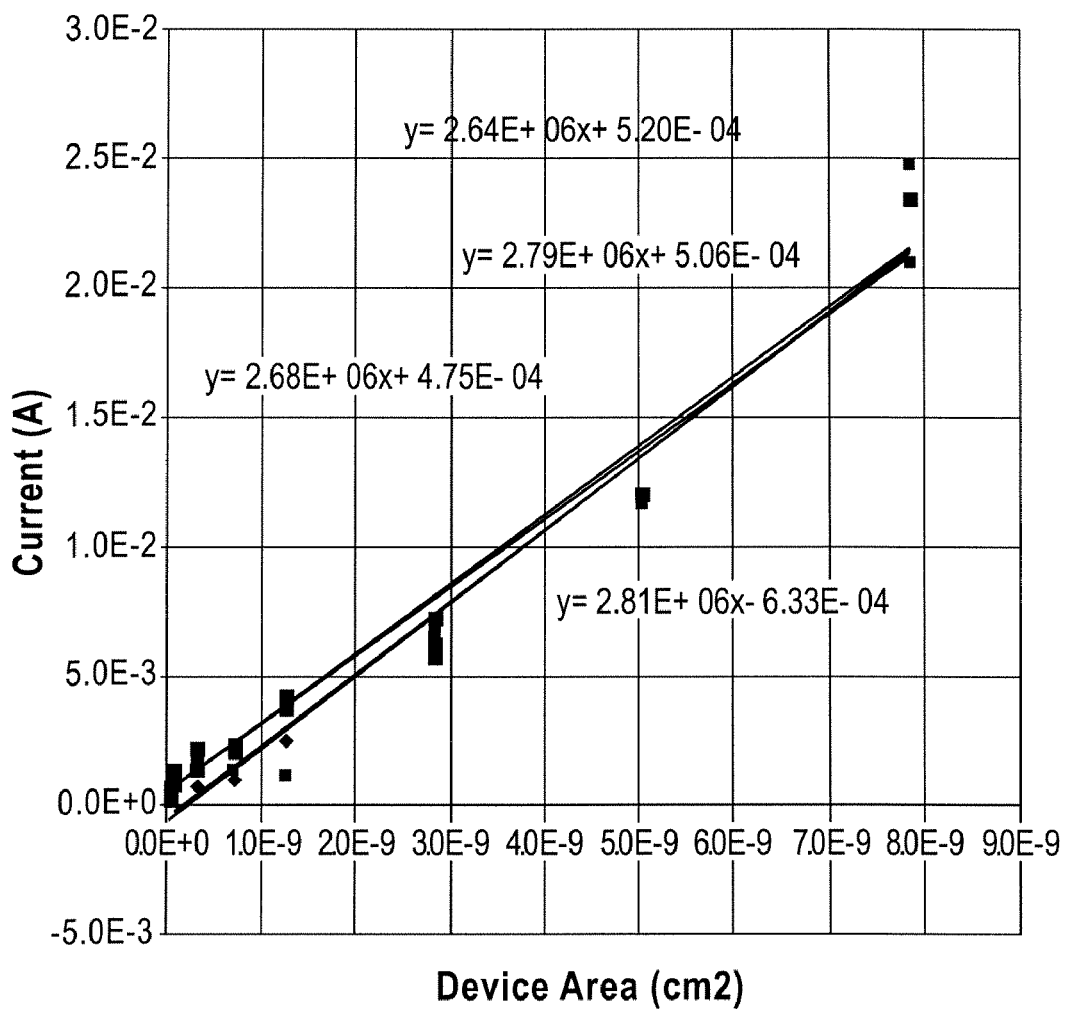
FIG. 10 is a plot of reset current as a function of bottom contact area for devices including first and second contact regions that are substantially equal in area.

The primary result depicted in FIG. 10 is that the reset current scales in proportion to the contact area over a wide range of contact areas. In contrast to the results shown for asymmetrical devices in FIG. 9, the data for the symmetrical devices shown in FIG. 10 indicate that no saturation of the reset current occurs for contact areas well below $1.0 \times 10^{-9}$ cm$^2$ and little or no offset current is observed. The data shown in FIG. 10 include contact areas within the sloped regime of FIG. 9. By maintaining symmetry in the top and bottom contact areas, the instant inventors have achieved scaling of reset current to smaller dimensions without encountering an offset current limit.

As described hereinabove and without wishing to be bound by theory, the instant inventors believe that similarity in the top and bottom contact areas inhibits lateral losses of electrical programming energy and promotes a more columnar shape for the programmed volume. Disparity in the areas of contact of the top and bottom electrodes with the phase-change material promotes a more plume-like shape for the programmed volume as electrical current emanating from a small bottom contact fans out when propagating toward a larger top contact. The lateral extent of the plume or fan out effect is controlled by the larger top contact area. Current emanating from the smaller bottom contact may propagate toward any portion of the larger top contact. The overall cross-sectional area of phase-change material sampled by the current is accordingly increased.

When the top and bottom contact areas are made to be similar, current emanating from the bottom contact is drawn to a top contact with a more limited lateral extent and this has the effect of concentrating the current in a more cylindrical, columnar, or tapered volume (where the taper narrows in the direction of current flow) and of inhibiting lateral dissipation of energy. When this occurs, losses are minimized and scaling of reset current with contact area extends to smaller dimensions without reaching a saturation point or offset current.

In one embodiment, the top and bottom contact areas are within a factor of two of each other, so that the area of the larger contact is between 100% and 200% of the area of the smaller contact. In a further embodiment, the top and bottom contact areas are within 50% of each other, so that the area of the larger contact is between 100% and 150% of the area of the smaller contact. In another embodiment, the top and bottom contact areas are within 25% of each other, so that the area of the larger contact is between 100% and 125% of the area of the smaller contact. In yet another embodiment, the top and bottom contact areas are within 10% of each other, so that the area of the larger contact is between 100% and 110% of the area of the smaller contact. In still another embodiment, the top and bottom contact areas are within 5% of each other, so that the area of the larger contact is between 100% and 105% of the area of the smaller contact. In one embodiment, the top and bottom contacts are vertically-aligned. In another embodiment, the top contact is staggered relative to the bottom contact. The shapes of the top and bottom contacts may be the same or different. In one embodiment, the area of contact of the top contact with the phase-change material is round (e.g. circular, curved, or elliptical) and the area of the bottom contact with the phase-change material is also round. In another embodiment, the area of contact of one of the contacts with the phase-change material is rectilinear (e.g. square or rectangular) and the area of contact of the other contact with the phase-change material is round.

The embodiments disclosed herein relate to vertically-oriented phase-change memory devices. However, the disclosure is not limited only to these embodiments. Thus, the teachings herein are also applicable to these devices, and others. The embodiments disclosed herein are merely examples of how to implement an improved phase-change memory device, including two similarly sized contact regions having a phase-change material between them. Additionally, it is also possible to have thin conductive layers between each contact and the phase-change material to provide an etch-stop layer and/or to alter the resistance of the contact region.

The present invention has been particularly shown and described with reference to the foregoing embodiments, which are merely illustrative of the best modes for carrying out the invention. It should be understood by those skilled in the art that various alternatives to the embodiments of the invention described herein may be employed in practicing the invention without departing from the spirit and scope of the invention as defined in the following claims. The embodiments should be understood to include all novel and non-obvious combinations of elements described herein, and claims may be presented in this or a later application to any novel and non-obvious combination of these elements. Moreover, the foregoing embodiments are illustrative, and no single feature or element is essential to all possible combinations that may be claimed in this or a later application.

With regard to the processes, methods, heuristics, etc. described herein, it should be understood that although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes described herein are provided for illustrating certain embodiments and should in no way be construed to limit the claimed invention.

Accordingly, it is to be understood that the above description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

All terms used in the claims are intended to be given their broadest reasonable constructions and their ordinary meanings as understood by those skilled in the art unless an explicit indication to the contrary is made herein. In particular, use of the singular articles such as "a," "the," "said," etc. should be read to recite one or more of the indicated elements unless a claim recites an explicit limitation to the contrary.

What is claimed is:

1. A memory device comprising:
a first electrode and a second electrode;
a phase-change material disposed between said first and second electrodes, said phase-change material being in electrical communication with said first and second electrodes over a first contact region and a second contact region, respectively;
a first insulator and a second insulator disposed on opposite sides of said phase-change material, wherein said first electrode protrudes through a first aperture in a first insulator, and said second electrode protrudes through a second aperture in a second insulator, and wherein said phase change material is a layer entirely spacedly separating said first insulator and said second insulator; and
wherein the area of said first contact region is about 100% to about 200% of the area of said second contact region.

2. The memory device of claim 1, wherein the area of said first contact region is about 100% to about 150% of the area of said second contact region.

3. The memory device of claim 1, wherein the area of said first contact region is about 100% to about 110% of the area of said second contact region.

4. The memory device of claim 1, wherein said first and second contact regions are generally circular.

5. The memory device of claim 4, wherein said first and second contact regions have a diameter of about four hundred (400) Angstroms to one thousand five hundred (1500) Angstroms.

6. The memory device of claim 4, wherein said first and second contact regions have a diameter of about four hundred (400) Angstroms to one thousand (1000) Angstroms.

7. The memory device of claim 1, wherein the shape of said first contact region differs from the shape of said second contact region.

8. The memory device of claim 7, wherein said first contact region is round.

9. The memory device of claim 1, wherein said phase-change material includes a programmed volume, said programmed volume having a generally cylindrical shape.

10. The memory device of claim 9, wherein said programmed volume contacts said first electrode and said second electrode.

11. The memory device of claim 1, wherein passage of current from said first electrode to said second electrode forms a programmed volume within said phase-change material, said programmed volume having a tapered shape, said tapered shape narrowing in the direction of said current.

12. The memory device of claim 1, wherein said phase-change material includes one or more elements selected from the group consisting of Te, Se, Ge, Sb, Bi, Pb, Sn, As, S, Si, P, O and mixtures or alloys thereof.

13. The memory device of claim 1, wherein said first contact region and said second contact region are not vertically aligned.

14. A memory device comprising:
a first insulator having a first hole therethrough and a first spacer around the inner periphery of said first hole, said spacer having a first sublithographic hole therethrough;
a second insulator having a second hole therethrough and a second spacer around the inner periphery of said second hole, said second spacer having a second sublithographic hole therethrough;
a phase-change material entirely spacedly separating said first and second insulators;
a first electrode formed through said first sublithographic hole and through said first insulator and being in electrical communication with said phase-change material at a first contact region;
a second electrode formed through said second sublithographic hole and through said second insulator and being in electrical communication with said phase-change material at a second contact region; and
wherein the area of said first contact region is about 100% to about 200% of the area of said second contact region.

15. The memory device of claim 14, wherein said first and second holes are sized to a lithographic process dimension.

16. The memory device of claim 14, wherein said first spacer and said second spacer comprise an insulator material.

17. The memory device of claim 14, wherein said first and second contact regions have a diameter of about two hundred (200) Angstroms to one thousand (1000) Angstroms.

18. The memory device of claim 14, wherein said first and second contact regions have a diameter of about two hundred (200) Angstroms to eight hundred (800) Angstroms.

19. The memory device of claim 14, wherein said phase-change material includes one or more elements selected from the group consisting of Te, Se, Ge, Sb, Bi, Pb, Sn, As, S, Si, P, O and mixtures or alloys thereof.

20. The memory device of claim 14, wherein the area of said first contact region is about 100% to about 150% of the area of said second contact region.

21. The memory device of claim 14, wherein the area of said first contact region is about 100% to about 110% of the area of said second contact region.

22. The memory device of claim 1, wherein said first aperture and said second aperture have substantially cylindrical walls therethrough.

* * * * *

UNITED STATES PATENT AND TRADEMARK OFFICE
CERTIFICATE OF CORRECTION

PATENT NO.       : 7,755,074 B2                              Page 1 of 1
APPLICATION NO.  : 11/871786
DATED            : July 13, 2010
INVENTOR(S)      : Sergey Kostylev et al.

It is certified that error appears in the above-identified patent and that said Letters Patent is hereby corrected as shown below:

Column 3, line 34, after the word phase-, delete the word "memory".

Please correct the description of FIG 8 as follows:

Column 3, line 37, after the word phase-, delete the word "memory".

Signed and Sealed this
Fifteenth Day of February, 2011

David J. Kappos
*Director of the United States Patent and Trademark Office*